United States Patent
Wang

(10) Patent No.: US 11,621,707 B2
(45) Date of Patent: Apr. 4, 2023

(54) SIGNAL OUTPUT CIRCUIT AND CIRCUIT FOR OUTPUTTING DELAYED SIGNAL

(71) Applicant: CHANGXIN MEMORY TECHNOLOGIES, INC., Hefei (CN)

(72) Inventor: Jia Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/668,756

(22) Filed: Feb. 10, 2022

(65) Prior Publication Data

US 2022/0294438 A1 Sep. 15, 2022

Related U.S. Application Data

(63) Continuation of application No. PCT/CN2021/113618, filed on Aug. 19, 2021.

(30) Foreign Application Priority Data

Mar. 9, 2021 (CN) .......................... 202110256939.4

(51) Int. Cl.
*H03K 5/15* (2006.01)
*H03K 5/1534* (2006.01)
*H03K 5/13* (2014.01)

(52) U.S. Cl.
CPC ............. *H03K 5/1534* (2013.01); *H03K 5/13* (2013.01); *H03K 5/15* (2013.01)

(58) Field of Classification Search
CPC ........... H03K 5/1534; H03K 5/13; H03K 5/15
See application file for complete search history.

(56) References Cited

U.S. PATENT DOCUMENTS 5,418,485 A * 5/1995 Duret ..................... G06K 19/07
327/227
6,271,702 B1 8/2001 Stansell
(Continued)

FOREIGN PATENT DOCUMENTS

CN 1716776 A 1/2006
CN 101102109 A 1/2008
(Continued)

OTHER PUBLICATIONS

Non-Final Office Action of the U.S. Appl. No. 17/665,734, dated Feb. 8, 2023, 15 pages.
(Continued)

*Primary Examiner* — Tuan T Lam
(74) *Attorney, Agent, or Firm* — Cooper Legal Group, LLC

(57) ABSTRACT

A signal output circuit and a circuit for outputting a delayed signal are provided. The signal output circuit includes: a first control subcircuit, configured to receive a first pulse signal and an input signal and output a first adjustment signal, a first preset edge of the first adjustment signal has a first delay relative to a rising edge of the input signal; a second control subcircuit configured to receive a second pulse signal and the input signal and output a second adjustment signal; and the signal output subcircuit is configured to receive the first adjustment signal and the second adjustment signal, and output a delayed output signal, a rising edge of the delayed output signal is generated according to the first preset edge of the first adjustment signal, and a falling edge of the delayed output signal is generated according to the second preset edge of the second adjustment signal.

20 Claims, 12 Drawing Sheets

(56) References Cited

U.S. PATENT DOCUMENTS

| | | | |
|---|---|---|---|
| 7,221,601 B2 | 5/2007 | Jacunski | |
| 7,629,828 B1 * | 12/2009 | Nekl | G06F 1/08 |
| | | | 327/407 |
| 7,868,671 B2 | 1/2011 | Park | |
| 8,570,086 B2 | 10/2013 | Hirairi | |
| 8,797,077 B2 | 8/2014 | Sasagawa | |
| 9,912,323 B1 * | 3/2018 | Ardalan | H03K 5/135 |
| 10,763,831 B2 | 9/2020 | Akondy et al. | |
| 10,763,833 B2 | 9/2020 | Muellner et al. | |
| 2003/0091135 A1 * | 5/2003 | Bonafos | H03K 5/1252 |
| | | | 375/350 |
| 2005/0149779 A1 | 7/2005 | Bleakley | |
| 2005/0242861 A1 | 11/2005 | Kanda | |
| 2006/0001599 A1 | 1/2006 | Onozawa et al. | |
| 2006/0044022 A1 * | 3/2006 | Tayler | H03K 5/1534 |
| | | | 327/24 |
| 2006/0152994 A1 | 7/2006 | Jacunski | |
| 2008/0012615 A1 | 1/2008 | Park | |
| 2010/0001777 A1 * | 1/2010 | Brantley | H03L 7/0816 |
| | | | 327/261 |
| 2014/0077855 A1 | 3/2014 | Sasagawa | |
| 2020/0177169 A1 | 6/2020 | Akondy et al. | |
| 2020/0212895 A1 | 7/2020 | Muellner et al. | |
| 2020/0321063 A1 * | 10/2020 | Tailliet | G11C 16/10 |

FOREIGN PATENT DOCUMENTS

| | | |
|---|---|---|
| CN | 102148614 A | 8/2011 |
| CN | 102215037 A | 10/2011 |
| CN | 202357595 U | 8/2012 |
| CN | 102769458 A | 11/2012 |
| CN | 103840796 A | 6/2014 |
| CN | 103944568 A | 7/2014 |
| CN | 106506001 A | 3/2017 |
| CN | 207475510 U | 6/2018 |
| CN | 207801891 U | 8/2018 |
| CN | 109388882 A | 2/2019 |
| CN | 208797912 U | 4/2019 |
| CN | 110428048 A | 11/2019 |
| CN | 110995207 A | 4/2020 |
| CN | 111277252 A | 6/2020 |
| GB | 2375666 A | 11/2002 |
| JP | 2014060669 A | 4/2014 |
| KR | 20110076672 A | 7/2011 |

OTHER PUBLICATIONS

Notice of Allowance of the U.S. Appl. No. 17/666,750, dated Dec. 14, 2022, 18 pages.

* cited by examiner

US 11,621,707 B2

SIGNAL OUTPUT CIRCUIT AND CIRCUIT FOR OUTPUTTING DELAYED SIGNAL

CROSS-REFERENCE TO RELATED APPLICATIONS

This is a continuation of International Application No. PCT/CN2021/113618, filed on Aug. 19, 2021, and entitled "Signal Output Circuit and Circuit for Outputting Delayed Signal", which claims priority to Chinese patent application No. 202110256939.4, filed on Mar. 9, 2021, and entitled "Signal Output Circuit and Circuit for Outputting Delayed Signal". The disclosures of International Application No. PCT/CN2021/113618 and Chinese patent application No. 202110256939.4 are hereby incorporated by reference in their entireties.

TECHNICAL FIELD

Embodiments of the disclosure relate to, but are not limited to, a signal output circuit and a circuit for outputting a delayed signal.

BACKGROUND

During the design of semiconductor circuits, stagger signals that are equally spaced are often used, and the stagger signals that are equally spaced may refer to the signal generated with a fixed delay in each interval.

For a synchronous signal, a clock signal is usually used to generate the stagger signals that are equally spaced; for an asynchronous signal, a delay unit is inserted to generate the stagger signals that are equally spaced. A delay between the signals can be achieved by inserting the corresponding delay unit according to requirements. The synchronous signal is used to generate the stagger signals that are equally spaced, the delay between the stagger signals that are equally spaced must be an integer multiple of a clock period, and the controllability of the delay between the stagger signals that are equally spaced is poor. The asynchronous signal is also used to generate the stagger signals that are equally spaced. In this way, although the delay between the signals may be well controllable, the area of the formed circuit layout and the power consumption of the circuit will be significantly increased.

SUMMARY

Embodiments of the disclosure provide a signal output circuit, which includes: a first control module, a second control module and a signal output module. The first control module is configured to receive a first pulse signal and an input signal, and output a first adjustment signal, a first preset edge of the first adjustment signal has a first delay relative to a rising edge of the input signal, the first delay being a pulse period of the first pulse signal. The second control module is configured to receive a second pulse signal and the input signal, and output a second adjustment signal, where a second preset edge of the second adjustment signal has a second delay relative to a falling edge of the input signal, the second delay being a pulse period of the second pulse signal. And the signal output module is configured to receive the first adjustment signal and the second adjustment signal, and output a delayed output signal, a rising edge of the delayed output signal is generated according to the first preset edge of the first adjustment signal, and a falling edge of the delayed output signal is generated according to the second preset edge of the second adjustment signal.

Embodiments of the disclosure further provide a delayed signal output circuit, which includes G signal output circuits mentioned above, where G is an integer greater than or equal to 2. Each stage of the signal output circuits is configured to receive a delayed output signal output by a previous-stage signal output circuit and generate a delayed output signal of a current-stage signal output circuit according to a first pulse signal, a second pulse signal and the delayed output signal output by the previous-stage signal output circuit. Each of non-first-stage signal output circuits is configured to receive the delayed output signal output by the previous-stage signal output circuit as an input signal of a respective one of the non-first-stage signal output circuits. And a first-stage signal output circuit is configured to receive an initial input signal as an input signal of the first-stage signal output circuit. A rising edge of the delayed output signal generated by each of the signal output circuits has a first delay relative to a rising edge of the received delayed output signal output by the previous-stage signal output circuit. And a falling edge of the delayed output signal generated by each of the signal output circuits has a second delay relative to a falling edge of the revived delayed output signal output by the previous-stage signal output circuit.

DETAILED DESCRIPTION

Figure 1:
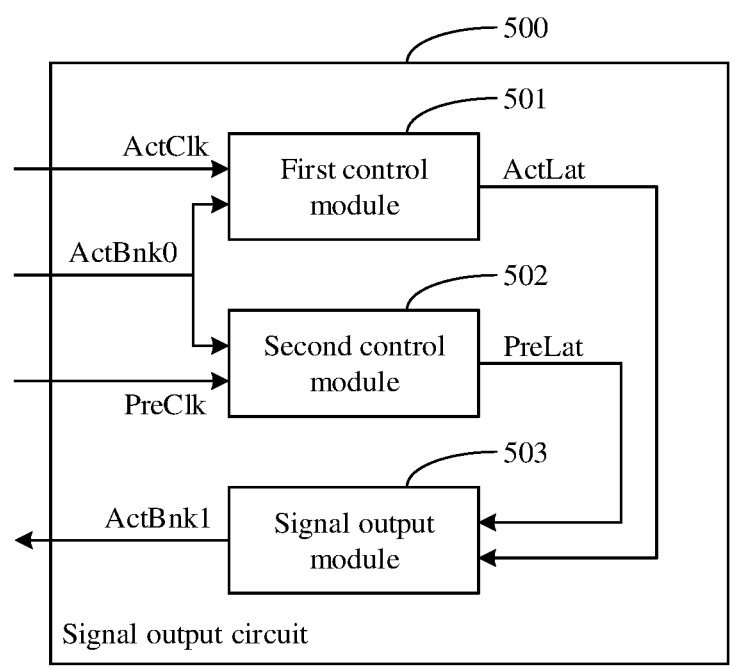
FIG. 1 illustrates a schematic structural diagram of a signal output circuit according to an embodiment of the disclosure.

In the art, the synchronous signal is used to generate the stagger signals that are equally spaced, the delay between the stagger signals that are equally spaced must be an integer multiple of the clock period, and the controllability of the delay between the stagger signals that are equally spaced is poor. The asynchronous signal is also used to generate the stagger signals that are equally spaced. In this way, although the delay between the signals may be well controllable, the area of the formed circuit layout and the power consumption of the circuit will be significantly increased.

However, the area of the circuit layout and the power consumption of the circuit can be reduced by adjusting the signal delay between the stagger signals that are equally spaced through the period of the pulse signal, and the delay between the signals does not need to be an integer multiple of the clock period. Thus, how to generate a delayed output signal according to a pulse signal will be a prerequisite for optimizing the generation of the stagger signals that are equally spaced.

The embodiments of the disclosure provide a signal output circuit, which includes: a first control module, a second control module and a signal output module. In specific implementations, the first control module, the second control module and the signal output module may be implemented as circuits or subcircuits. The first control module is configured to receive a first pulse signal and an input signal, and output a first adjustment signal, where a first preset edge of the first adjustment signal has a first delay relative to a rising edge of the input signal, first delay being a pulse period of the first pulse signal. The second control module is configured to receive a second pulse signal and the input signal, and output a second adjustment signal, where a second preset edge of the second adjustment signal has a second delay relative to the falling edge of the input signal, the second delay being a pulse period of the second pulse signal. And the signal output module is configured to receive the first adjustment signal and the second adjustment signal, and output a delayed output signal, where a rising edge of the delayed output signal is generated according to the first preset edge of the first adjustment signal, and a falling edge of the delayed output signal is generated according to the second preset edge of the second adjustment signal.

In order to make the objectives, technical solutions, and advantages of the embodiments of the disclosure clearer, the various embodiments of the disclosure will be described in detail below with reference to the accompanying drawings. However, those of ordinary skill in the art can understand that, in each embodiment of the disclosure, many technical details are proposed for the reader to better understand the disclosure. However, even without these technical details as well as various changes and modifications according to the following embodiments, the technical solution claimed in the disclosure can be realized. The following divisions of the various embodiments are for convenience of description, and should not constitute any limitation on the specific implementation manners of the disclosure, and the various embodiments may be combined with each other under the premise of no contradiction.

Figure 2:
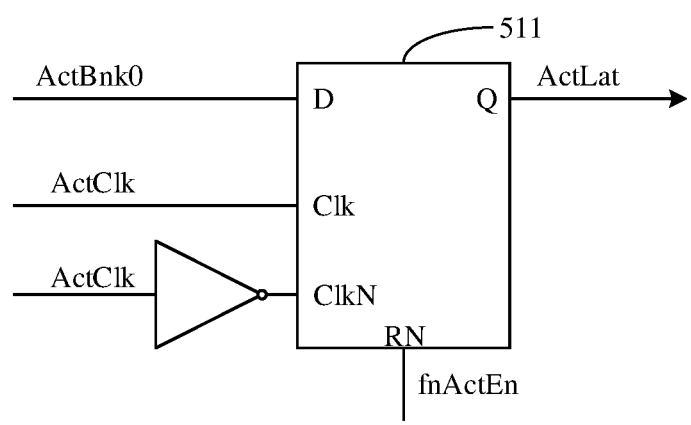
FIG. 2 illustrates a schematic diagram of a specific circuit in a first control module according to an embodiment of the disclosure.
Figure 3:
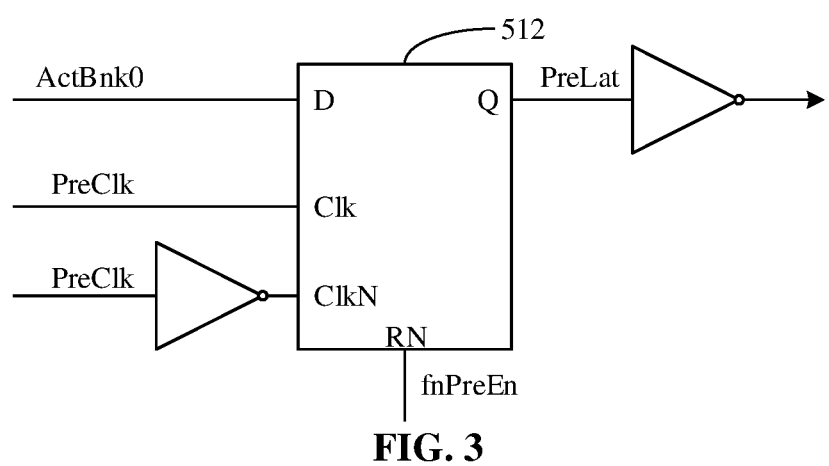
FIG. 3 illustrates a schematic diagram of a specific circuit in a second control module according to an embodiment of the disclosure.
Figure 4:
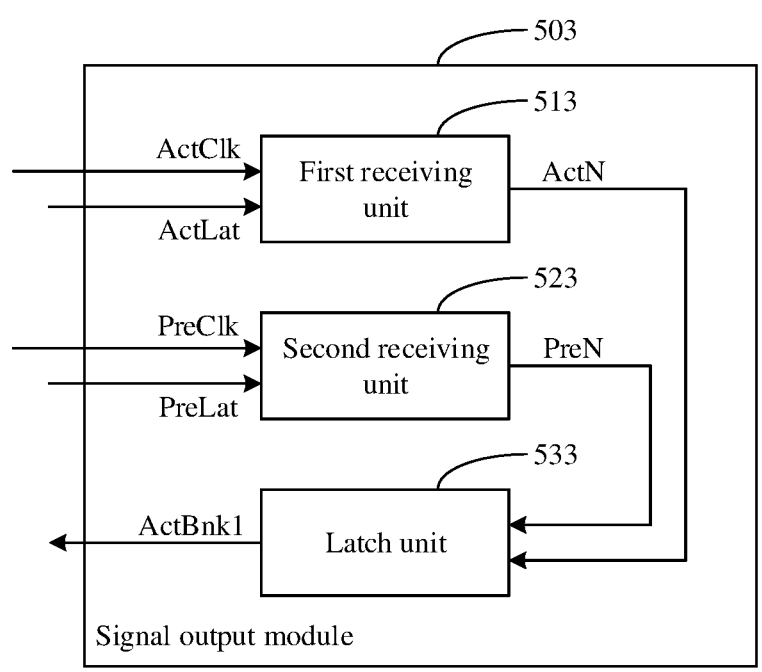
FIG. 4 illustrates a schematic structural diagram of a signal output module according to an embodiment of the disclosure.
Figure 5:
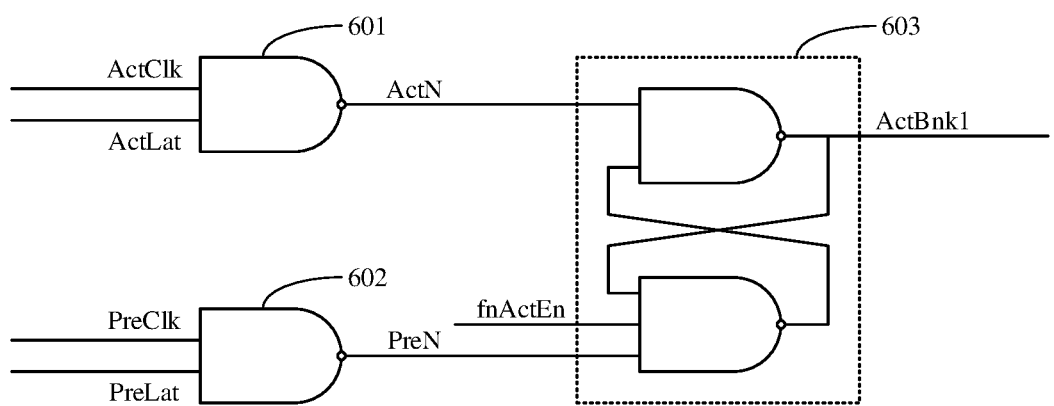
FIGS. 5 and 6 illustrate schematic diagrams of specific circuits in a signal output module according to an embodiment of the disclosure.
Figure 6:
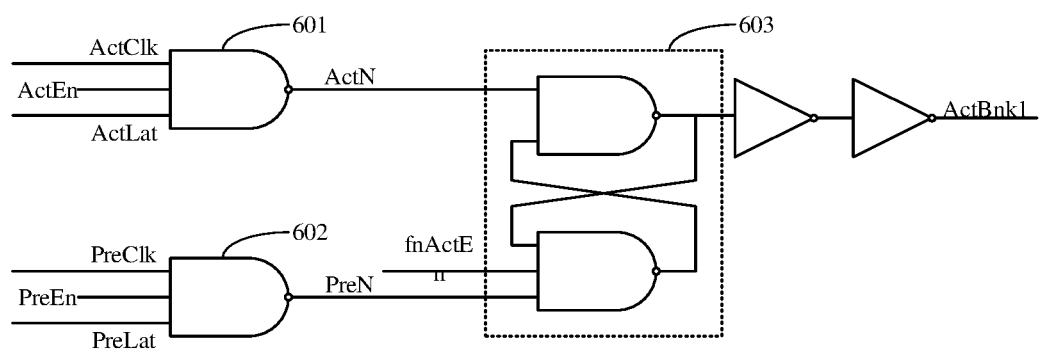
Figure 7:
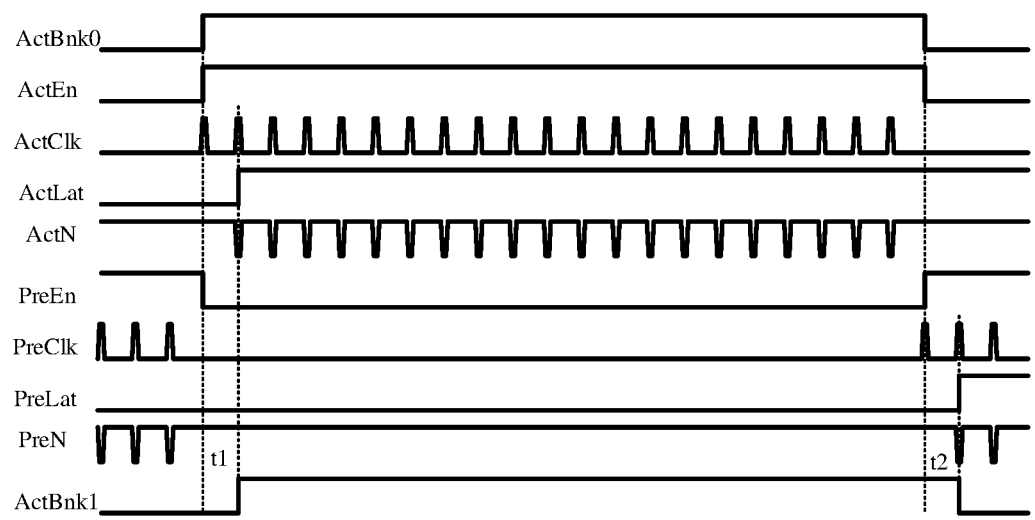
FIG. 7 illustrates a schematic diagram of a time sequence of signals in a signal output circuit according to an embodiment of the disclosure.

FIG. 1 illustrates a schematic structural diagram of a signal output circuit according to an embodiment of the disclosure, FIG. 2 illustrates a schematic diagram of a specific circuit in a first control module according to an embodiment of the disclosure, FIG. 3 illustrates a schematic diagram of a specific circuit in a second control module according to an embodiment of the disclosure, FIG. 4 illustrates a schematic structural diagram of a signal output module according to an embodiment of the disclosure, FIGS. 5 and 6 illustrate schematic diagrams of specific circuits in a signal output module according to an embodiment of the disclosure, FIG. 7 illustrates a schematic diagram of a time sequence of signals in a signal output circuit according to an embodiment of the disclosure. The signal output circuit according to the embodiments of the disclosure will be further described in detail below in combination with the accompanying drawings.

Referring to FIG. 1, a circuit 500 for outputting a signal includes a first control module 501 configured to receive a first pulse signal ActClk and an input signal ActBnk0, and output a first adjustment signal ActLat, where a first preset edge of the first adjustment signal has a first delay relative to a rising edge of the input signal ActBnk0, the first delay being a pulse period of the first pulse signal ActClk.

In some embodiments of the disclosure, the rising edge or falling edge of the first pulse signal ActClk may be used to sample the input signal ActBnk0, and then the first adjustment signal ActLat may be output; or after detecting the rising edge or falling edge of the first pulse signal ActClk, the output of the input signal ActBnk0 may be delayed so as to acquire the first adjustment signal ActLat.

In the embodiments of the disclosure, the first preset edge may be the rising edge as an example for illustration. The input signal ActBnk0 may be an external input signal (compared to the signal output circuit 500), and the signal output circuit 500 may be configured to generate a delayed output signal ActBnk1 according to the input signal ActBnk0. A rising edge of the delayed output signal ActBnk1 may be generated according to the rising edge of the first adjustment signal ActLat, and there may be the first delay between the rising edge of the first adjustment signal ActLat and the rising edge of the input signal ActBnk0. That is, the rising edge of the delayed output signal ActBnk1 may have a first delay relative to the rising edge of the input signal ActBnk0, and the first delay may be a pulse period of the first pulse signal ActClk. Therefore, it can be seen that the first pulse signal ActClk input externally may be configured to adjust the delay of the rising edge of the delayed output signal ActBnk1. It should be noted that, in some embodiments of the disclosure, the first preset edge may also be a falling edge.

It should be noted that, in the description of "the rising edge of the delayed output signal ActBnk1 may be generated according to the first preset edge of the first adjustment signal ActLat", the meaning of "according to" may include but is not limited to: the rising edge of the delayed output signal ActBnk1 may be generated in response to detecting the first preset edge of the first adjustment signal ActLat; or the rising edge of the delayed output signal ActBnk1 may be generated, after detecting that the first adjustment signal ActLat changes from a low level to a high level (or changing from the high level to the low level).

In some embodiments of the disclosure referring to FIG. 2, the first control module 501 may include a first D-trigger 511, where a clock terminal of the first D-trigger 511 may be configured to receive the first pulse signal ActClk, a reset terminal of the first D-trigger 511 may be configured to receive a first reset signal fnActEn, an input terminal of the first D-trigger 511 may be configured to receive the input signal ActBnk0, and an output terminal of the first D-trigger 511 may be configured to output the first adjustment signal ActLat.

Continuing to refer to FIG. 1, the signal output circuit 500 further includes a second control module 502, configured to receive a second pulse signal PreClk and the input signal ActBnk0, and output a second adjustment signal PreLat, where a second preset edge of the second adjustment signal PreLat has a second delay relative to the falling edge of the input signal ActBnk0, the second delay being a pulse period of the second pulse signal PreClk.

In the embodiments of the disclosure, the second preset edge may be the rising edge as an example for illustration. The falling edge of the delayed output signal ActBnk1 may be generated according to the rising edge of the second adjustment signal PreLat, and there may be a second delay between the rising edge of the second adjustment signal PreLat and the falling edge of the input signal ActBnk0. That is, the falling edge of the delayed output signal ActBnk1 may have the second delay relative to the falling edge of the input signal ActBnk0, and the second delay may be a pulse period of the second pulse signal PreClk. Therefore, it can be seen that the second pulse signal PreClk input externally may be configured to adjust the delay of the falling edge of the delayed output signal ActBnk1. It should be noted that in some embodiments of the disclosure, the second preset edge may also be a falling edge.

It should be noted that, in the description of "the falling edge of the delayed output signal ActBnk1 may be generated according to the second preset edge of the second adjustment signal PreLat", the meaning of "according to" may include but is not limited to: the falling edge of the delayed output signal ActBnk1 may be generated in response to detecting the second preset edge of the second adjustment signal PreLat; or the falling edge of the delayed output signal ActBnk1 may be generated, after detecting that the second adjustment signal PreLat changes from a low level to a high level (or changing from the high level to the low level).

In some embodiments of the disclosure, referring to FIG. 3, the second control module 502 may include a second D-trigger 512, where a clock terminal of the second D-trigger 512 may be configured to receive the second pulse signal PreClk, a reset terminal of the second D-trigger 512 may be configured to receive a second reset signal fnPreEn, an input terminal of the second D-trigger 512 may be configured to receive the input signal ActBnk0, and an output terminal of the second D-trigger 512 may be serially connected with an inverter and configured to output the second adjustment signal at an output of the inverter.

In the embodiments of the disclosure, the pulse period of the first pulse signal ActClk may be equal to the pulse period of the second pulse signal PreClk, and the delay degree of the rising edge of the first adjustment signal ActLat may be the same as the delay degree of the rising edge of the second adjustment signal PreLat. In some embodiments of the disclosure, the pulse period of the first pulse signal and the pulse period of the second pulse signal may be different.

In addition, in the embodiments of the disclosure, one pulse of the first pulse signal ActClk may be aligned with the rising edge of the input signal ActBnk0, and one pulse of the second pulse signal PreClk may be aligned with the falling edge of the input signal ActBnk0. It should be noted that the "be aligned" described here may not be necessarily perfect alignment under ideal conditions, and may include subtle differences in the rising/falling edges caused by factors such as circuit delays. One pulse of the first pulse signal ActClk may be aligned with the rising edge of the input signal ActBnk0, to ensure the accuracy of the first delay between the first signal edge of the first adjustment signal ActLat and the rising edge of the input signal ActBnk0. One pulse of the second pulse signal PreClk may be aligned with the falling edge of the input signal ActBnk0, to ensure the accuracy of the second delay between the second signal edge of the second adjustment signal PreLat and the falling edge of the input signal ActBnk0. Continuing to refer to FIG. 1, the signal output circuit 500 further includes: a signal output module 503, configured to receive the first adjustment signal ActLat and the second adjustment signal PreLat, and output the delayed output signal ActBnk1, where the rising edge of the delayed output signal ActBnk1 is generated according to the first preset edge of the first adjustment signal ActLat, and the falling edge of the delayed output signal ActBnk1 is generated according to the second preset edge of the second adjustment signal PreLat.

In some embodiments of the disclosure, referring to FIG. 4, the signal output module 503 may include: a first receiving unit 513, a second receiving unit 523 and a latch unit 533. In specific implementations, the first receiving unit 513, the second receiving unit 523 and the latch unit 533 may be implemented as circuits or subcircuits. The first receiving unit 513 may be configured to receive the first pulse signal ActClk and the first adjustment signal ActLat, and generate a first pulse control signal ActN when the first adjustment signal ActLat is at an active level, where a pulse phase of the first pulse control signal ActN may be the same as a pulse phase of the first pulse signal ActClk. The second receiving unit 523 may be configured to receive the second pulse signal PreClk and the second adjustment signal PreLat, and generate a second pulse control signal PreN when the second adjustment signal PreLat is at an active level, and a pulse phase of the second pulse control signal PreN may be the same as a pulse phase of the second pulse signal PreClk. And the latch unit 533 may be configured to receive the first pulse control signal ActN and the second pulse control signal PreN, and generate the delayed output signal ActLat.

In some embodiments of the disclosure, when the first adjustment signal ActLat is determined as an active level, the first pulse control signal ActN may be generated by the first pulse signal ActClk according to the inverter. When the second adjustment signal PreLat is detected as an active level, the second pulse control signal PreN may be generated by the second pulse signal PreClk according the inverter.

In some embodiments of the disclosure, referring to FIG. 5, the first receiving unit 513 may include a first receiving NAND gate 601, and the first receiving NAND gate 601 may include a first input terminal that is configured to receive the first adjustment signal ActLat, a second input terminal that is configured to receive the first pulse signal ActClk, and a first output terminal that is configured to output the first pulse control signal ActN. The second receiving unit 523 may include a second receiving NAND gate 602, and the second receiving NAND gate 602 may include a third input terminal that is configured to receive the second adjustment signal PreLat, a fourth input terminal that is configured to receive the second pulse signal PreClk, and a second output terminal that is configured to output the second pulse control signal PreN. The latch unit 533 may include a latch, and the latch may include a fifth input terminal that is configured to receive the first pulse control signal ActN, a sixth input terminal that is configured to receive the second pulse control signal PreN, and a third output terminal that is configured to output the delayed output signal ActBnk1.

The latch unit 603 may be configured such that: the delayed output signal ActBnk1 and the second pulse control signal PreN may be both at a same level, when the first pulse control signal ActN and the second pulse control signal PreN are at different levels; and the latch unit 603 may maintain a state, when the first pulse control signal ActN and the second pulse control signal PreN may be both at high levels.

In the embodiments of the disclosure, when the first pulse signal ActN and the second pulse control signal PreN are both at high levels, the latch unit 603 may maintain the state; when the first pulse control signal ActN is at the high level and the second pulse signal control signal PreN is at a low level, the latch unit 603 may output the low level; and when the first pulse control signal ActN is at the low level and the second pulse signal control signal PreN is at the high level, the latch unit 603 may output the high level.

In some embodiments of the disclosure, the first receiving unit 513 may further be configured to receive a first control signal ActEn, and generate the first pulse control signal ActN according to the first pulse signal ActClk when the first adjustment signal ActLat and the first control signal ActEn are both at active levels. The second receiving unit 523 may further be configured to receive a second control signal PreEn, and generate the second pulse control signal PreN according to the second pulse signal PreClk when the second adjustment signal PreLat and the second control signal PreEn may be both at active levels.

Referring to FIG. 6, the first receiving NAND gate 601 may further be configured to receive a first control signal ActEn, and generate the first pulse control signal ActN according to the first clock signal ActClk, the first control signal ActEn, and the first adjustment signal ActLat. The second receiving NAND gate 602 may further be configured to receive a second control signal PreEn, and generate the second pulse control signal PreN according to the second clock signal PreClk, the second control signal PreEn, and the second adjustment signal PreLat. The first control signal ActEn and the second control signal PreEn may be both inverted signals, the first pulse signal ActClk may exist when the first control signal ActEn is at an active level, and the second pulse signal PreClk may exist when the second control signal PreEn is at an active level. The first control signal ActEn and the second control signal PreEn may be respectively received by the first receiving NAND gate 601 and the second receiving NAND gate 602, to ensure the stability of the output of the first receiving NAND gate 601 and the second receiving NAND gate 602.

In some embodiments of the disclosure, the first pulse signal ActClk and the second pulse signal PreClk may be staggered with each other, and the staggered pulse signals may be pulse signals generated according to the inverted signals. In the embodiments of the disclosure, the first pulse signal ActClk may exist when the first control signal ActEn is at an active level, and the initial pulse of the first pulse signal ActClk may be aligned with the rising edge of the first control signal ActEn. The second pulse signal PreClk may exist when the second control signal PreEn is at an active level, and the initial pulse of the second pulse signal PreClk may be aligned with the rising edge of the second control signal PreEn. It should be noted that the "be aligned" described here may not be necessarily perfect alignment under ideal conditions, and may include subtle differences in the rising/falling edges due to factors such as the circuit delays.

In some embodiments of the disclosure, referring to FIG. 7, the input signal ActBnk0, the first pulse signal ActClk, and the second pulse signal PreClk may be external input signals. And assuming that the period of the first pulse signal ActClk is t1, the period of the second pulse signal PreClk may be t2. With reference to FIG. 2, the first adjustment signal ActLat may be generated according to the input signal ActBnk0 and the first pulse signal ActClk, and when the first pulse signal ActClk is at the high level, the secondary state of the first adjustment signal ActLat may be the current state of the input signal ActBnk0. Therefore, there may be the first delay between the rising edge of the first adjustment signal ActLat and the rising edge of the input signal ActBnk0, and the first delay may be the period of the first pulse signal ActClk; that is, the delay between the rising edge of the first adjustment signal ActLat and the rising edge of the input signal ActBnk0 may be t1. Referring to FIG. 3, the second adjustment signal PreLat may be generated according to the input signal ActBnk0 and the second pulse signal PreClk; and when the second pulse signal PreClk may be at the high level, the secondary state of the second adjustment signal PreLat may be the current state of the input signal ActBnk0. Therefore, there may be the second delay between the rising edge of the second adjustment signal PreLat and the falling edge of the input signal ActBnk0, and the second delay may be the period of the second pulse signal PreClk; that is, the delay between the rising edge of the second adjustment signal PreLat and the falling edge of the input signal ActBnk0 may be t2. Referring to FIG. 6, in order to ensure the stability of the output of the first receiving NAND gate 601 and the second receiving NAND gate 602, the first receiving NAND gate 601 may further be configured to receive the first control signal ActEn, and the second receiving NAND gate 602 may further be configured to receive the second control signal PreEn, where the first control signal ActEn and the second control signal PreEn may be inverted signals. At this time, the first receiving NAND gate 601 and the second receiving NAND gate 602 may be configured to respectively generate the first pulse control signal ActN and the second pulse control signal PreN. The latch unit 603 may be configured to generate the delayed output signal ActBnk1 according to the first pulse control signal ActN and the second pulse control signal PreN. There may be the first delay between the rising edge of the delayed output signal ActBnk1 and the rising edge of the input signal ActBnk0, and the first delay is the pulse period t1 of the first pulse signal ActClk. And there may be the second delay between the falling edge of the delayed output signal ActBnk1 and the falling edge of the input signal ActBnk0, and the second delay may be the pulse period t2 of the second pulse signal PreClk. In the embodiments of the disclosure, the pulse period of the first pulse signal ActClk may be equal to the pulse period of the second pulse signal PreClk, that is, the signal changing edge of the delayed output signal ActBnk1 may have an equal time delay relative to the signal changing edge of the input signal ActBnk0. It should be noted that the diagram of the time sequence of each signal shown in FIG. 7 may be only used to interpret the circuit function of the signal output circuit 500 according to the embodiments of the disclosure, and does not constitute a limitation to the embodiments of the disclosure. In some embodiments of the disclosure, the corresponding delay input signal may be generated according to other input signals; in addition, the input signal may also be inconsistent with the first control signal.

It should be noted that in some embodiments of the disclosure, the signal output circuit may further include an even number of inverters, and the inverters may be serially connected with an output terminal of the signal output module, so as to enhance the driving capability of the signal output circuit.

It should be understood that the delayed output signal with a controllable delay may be generated according to the first pulse signal and the second pulse signal. Compared with the input signal, the delayed output signal may have the first delay on the rising edge and the second delay on the falling edge; the first delay may be the pulse period of the first pulse signal, and the second delay may be the pulse period of the second pulse signal. Therefore, the delay time of the delayed output signal can be adjusted by adjusting the pulse period of the first pulse signal and the pulse period of the second pulse signal. At the same time, the operation of adjusting the delay time of the delayed output signal does not need to connect more delay units, thereby simplifying the circuit structure, and making the area of the circuit layout smaller and the power consumption of the circuit lower.

It is worth mentioning that all of the units involved in the embodiments of the disclosure may be logical units. In practical applications, a logical unit can be realized by a physical unit, a part of the physical unit, or the combination of a plurality of physical units. In addition, in order to highlight the innovative part of the disclosure, the embodiments of the disclosure do not introduce units that are not closely related to solving the technical problems proposed by the disclosure, which does not indicate that there are no other units in the embodiments of the disclosure.

The embodiments of the disclosure further provides a circuit for outputting a delayed signal, which includes G the signal output circuits mentioned above, where G is an integer greater than or equal to 2. Each stage of the signal output circuits is configured to receive a delayed output signal output by a previous-stage signal output circuit, and generate a delayed output signal of a current-stage signal output circuit according to a first pulse signal, a second pulse signal and the delayed output signal output by the previous-stage signal output circuit. Each of non-first-stage signal output circuits is configured to receive the delayed output signal output by the previous-stage signal output circuit as an input signal of a respective one of the non-first-stage signal output circuits, and a first-stage signal output circuit is configured to receive an initial input signal as an input signal of the first-stage signal output circuit. A rising edge of the delayed output signal generated by each of the signal output circuits has a first delay relative to a rising edge of the received delayed output signal output by the previous-stage signal output circuit. Additionally, a falling edge of the delayed output signal generated by each of the signal output circuits has a second delay relative to a falling edge of the revived delayed output signal output by the previous-stage signal output circuit.

Figure 8:
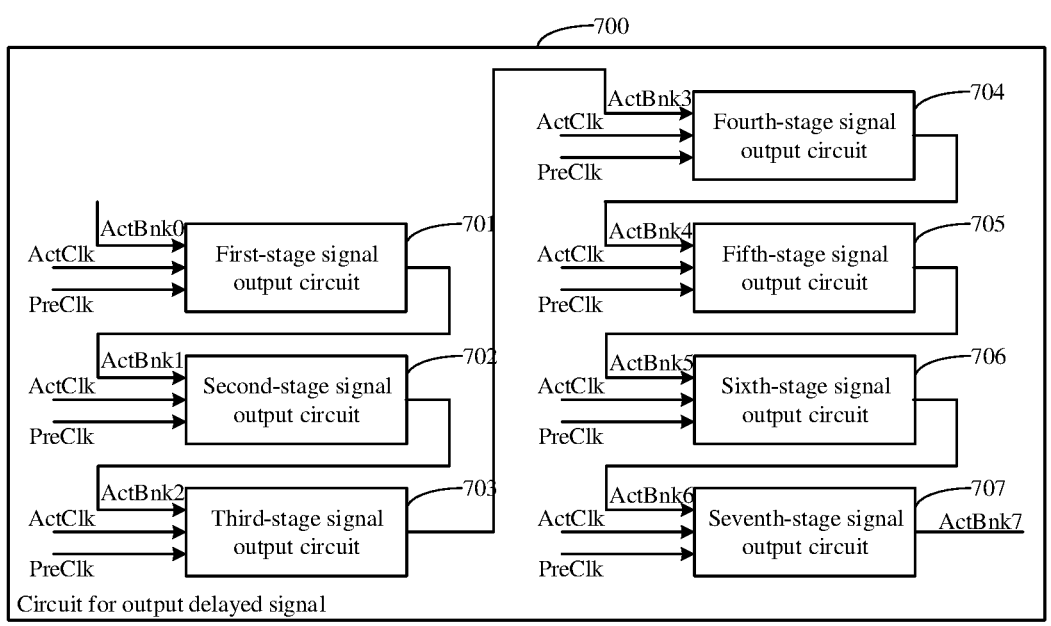
FIGS. 8 and 9 illustrate schematic structural diagrams of a circuit for outputting a delayed signal according to an embodiment of the disclosure.
Figure 9:
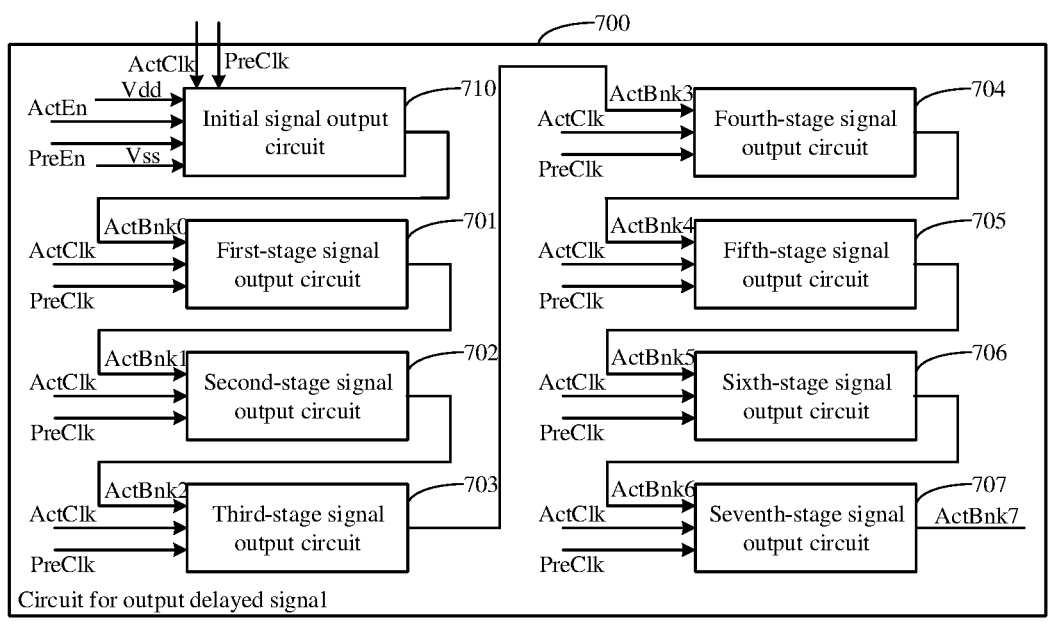
Figure 10:
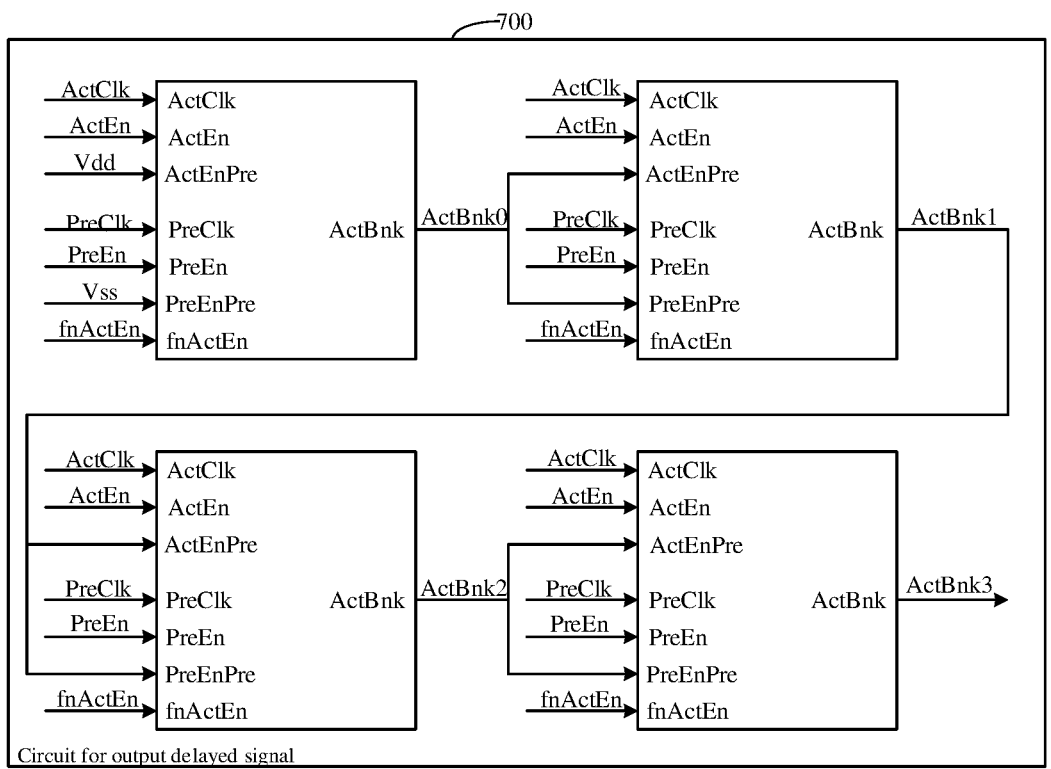
FIG. 10 illustrates a schematic diagram of a specific circuit of a circuit for outputting a delayed signal according to an embodiment of the disclosure.
Figure 11:
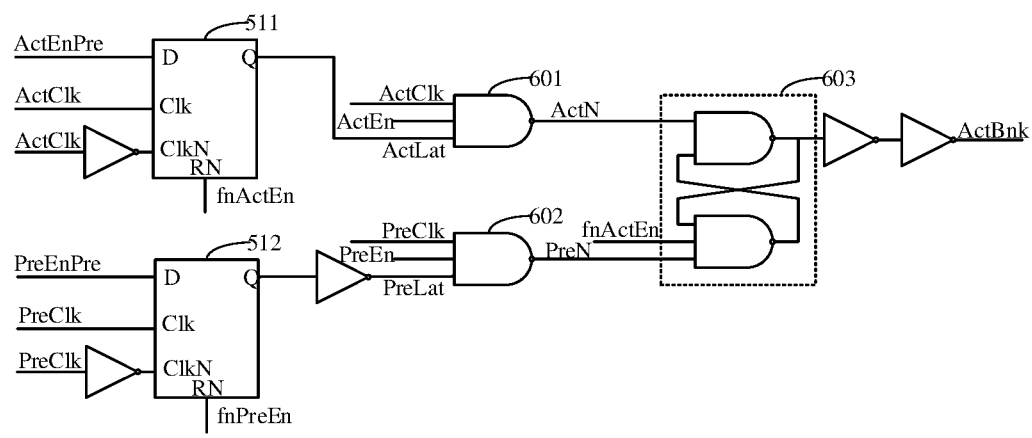
FIG. 11 illustrates a schematic diagram of a specific circuit of a signal output circuit in a circuit for outputting a delayed signal according to an embodiment of the disclosure.
Figure 12:
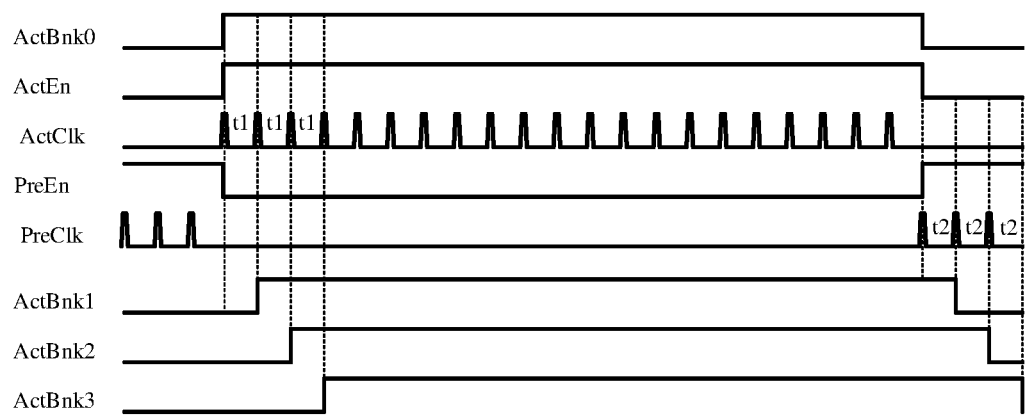
FIG. 12 illustrates a schematic diagram of a time sequence of signals in a circuit for outputting a delayed signal according to an embodiment of the disclosure.

FIGS. 8 and 9 illustrate schematic structural diagrams of a circuit for outputting a delayed signal according to an embodiment of the disclosure, FIG. 10 illustrates a schematic diagram of a specific circuit of a circuit for outputting a delayed signal according to an embodiment of the disclosure, FIG. 11 illustrates a schematic diagram of a specific circuit of a signal output circuit in a circuit for outputting a delayed signal according to an embodiment of the disclosure, FIG. 12 illustrates a schematic diagram of a time sequence of signals in a circuit for outputting a delayed signal according to an embodiment of the disclosure. Hereinafter, the circuit for outputting the delayed signal according to the embodiments of the disclosure will be described in detail with reference to the accompanying drawings, the parts that are the same as or corresponding to the aforementioned embodiments will not be described in detail below.

The circuit for outputting the delayed signal includes G signal output circuits 500 according to the aforementioned embodiments, where G is an integer greater than or equal to 2. Each stage of the signal output circuits is configured to receive a delayed output signal output by a previous-stage signal output circuit, and generate a delayed output signal of a current-stage signal output circuit according to a first pulse signal ActClk, a second pulse signal PreClk and the delayed output signal output by the previous-stage signal output circuit. Each of non-first-stage signal output circuits is configured to receive the delayed output signal output by the previous-stage signal output circuit as an the input signal of a respective one of the non-first-stage signal output circuits, and a first-stage signal output circuit is configured to receive an initial input signal as an input signal of the first-stage signal output circuit. A rising edge of the delayed output signal generated by each of the signal output circuits has a first delay relative to a rising edge of the received delayed output signal output by the previous-stage signal output circuit. Additionally, a falling edge of the delayed output signal generated by each of the signal output circuits has a second delay relative to a falling edge of the revived delayed output signal output by the previous-stage signal output circuit.

In the embodiments of the disclosure, the pulse period of the first pulse signal ActClk may be t1, the pulse period of the second pulse signal PreClk may be t2, and the pulse period of the first pulse signal ActClk may be equal to the pulse period of the second pulse signal PreClk. In some embodiments of the disclosure, the pulse period of the first pulse signal and the pulse period of the second pulse signal may be different.

Referring to FIG. 8, in the embodiments of the disclosure, the circuit 700 for outputting the delayed signal may include seven signal output circuits 500 according to the aforementioned embodiments as an example for specific description, which does not constitute a limitation of the embodiments of the disclosure. Specifically, a first-stage signal output circuit 701, a second-stage signal output circuit 702, a third-stage signal output circuit 703, a fourth-stage signal output circuit 704, a fifth-stage signal output circuit 705, a sixth-stage signal output circuit 706, and a seventh-stage signal output circuit 707. In some embodiments of the disclosure, the circuit for outputting the delayed signal may include two or more signal output circuits.

In the embodiments of the disclosure, the first-stage signal output circuit 701 may be configured to generate the first-stage delayed output signal ActBnk1 according to the initial input signal ActBnk0, the first pulse signal ActClk, and the second pulse signal PreClk. The rising edge may have a first delay relative to the rising edge of the initial input signal ActBnk0, and the first delay may be the pulse period t1 of the first pulse signal ActClk. The falling edge of the first-stage delayed output signal ActBnk1 may have a second delay relative to the falling edge of the initial input signal ActBnk0, and the second delay may be the pulse period t2 of the second pulse signal PreClk.

The second-stage signal output circuit 702 may be configured to generate a second-stage delayed output signal ActBnk2 according to the first-stage delayed output signal ActBnk1, the first pulse signal ActClk, and the second pulse signal PreClk. The rising edge of the second-stage delayed output signal ActBnk2 may have a first delay relative to the first-stage delayed output signal ActBnk1; and the falling edge of the second-stage delayed output signal ActBnk2 may have a second delay relative to the first-stage delayed output signal ActBnk1.

The third-stage signal output circuit 703 may be configured to generate a third-stage delayed output signal ActBnk3 according to the second-stage delayed output signal ActBnk2, the first pulse signal ActClk, and the second pulse signal PreClk. The rising edge of the third-stage delayed output signal ActBnk3 may have a first delay relative to the second-stage delayed output signal ActBnk2; and the falling edge of the third-stage delayed output signal ActBnk3 may have a second delay relative to the second-stage delayed output signal ActBnk2.

The fourth-stage signal output circuit 704 may be configured to generate a fourth-stage delayed output signal ActBnk4 according to the third-stage delayed output signal ActBnk3, the first pulse signal ActClk, and the second pulse signal PreClk. The rising edge of the fourth-stage delayed output signal ActBnk4 may have a first delay relative to the third-stage delayed output signal ActBnk3; and the falling edge of the fourth-stage delayed output signal ActBnk4 may have a second delay relative to the third-stage delayed output signal ActBnk3.

The fifth-stage signal output circuit 705 may be configured to generate a fifth-stage delayed output signal ActBnk5 according to the fourth-stage delayed output signal ActBnk4, the first pulse signal ActClk, and the second pulse signal PreClk. The rising edge of the fifth-stage delayed output signal ActBnk5 may have a first delay relative to the fourth-stage delayed output signal ActBnk4; and the falling edge of the fifth-stage delayed output signal ActBnk5 may have a second delay relative to the fourth-stage delayed output signal ActBnk4.

The sixth-stage signal output circuit 706 may be configured to generate a sixth-stage delayed output signal ActBnk6 according to the fifth-stage delayed output signal ActBnk5, the first pulse signal ActClk, and the second pulse signal PreClk. The rising edge of the sixth-stage delayed output signal ActBnk6 may have a first delay relative to the fifth-stage delayed output signal ActBnk5; and the falling edge of the sixth-stage delayed output signal ActBnk6 may have a second delay relative to the fifth-stage delayed output signal ActBnk5.

The seventh-stage signal output circuit 707 may be configured to generate a seventh-stage delayed output signal ActBnk7 according to the sixth-stage delayed output signal ActBnk6, the first pulse signal ActClk, and the second pulse signal PreClk. The rising edge of the seventh-stage delayed output signal ActBnk7 may have a first delay relative to the sixth-stage delayed output signal ActBnk6; and the falling edge of the seventh-stage delayed output signal ActBnk7 may have a second delay relative to the sixth-stage delayed output signal ActBnk6.

Referring to FIG. 9, in the embodiments of the disclosure, the first control module of the signal output circuits may further be configured to receive a first control signal ActEn. And the second control module of the signal output circuits may further be configured to receive a second control signal PreEn. The first pulse signalActClk and the second pulse signal PreClk may be inverted signals. The each stage of the signal output circuits may be configured to generate the delayed output signal of the current-stage signal output circuit according to the first control signal ActEn, the second control signal PreEn, the first pulse signal ActClk, the second pulse signal PreClk and the delayed output signal output by the previous-stage signal output circuit. By receiving the first control signal ActEn and the second control signal PreEn, the stability of the output by the signal output circuit can be ensured.

Continuing to refer to FIG. 9, in the embodiments of the disclosure, the circuit 700 for outputting the delayed signal may further include: an initial signal output circuit 710 that includes a first control module, a second control module, and a signal output module. In specific implementations, the first control module, the second control module, and the signal output module may be implemented as circuits or subcircuits. The first control module of the initial signal output circuit may be configured to receive the first pulse signal ActClk and a first power signal Vdd, and generate the first adjustment signal (not illustrated) according to the first pulse signal ActClk and the first power signal Vdd. The second control module of the initial signal output circuit may be configured to receive a second pulse signal PreClk and a second power signal Vss, and generate the second adjustment signal (not illustrated) according to the second pulse signal PreClk and the second power signal Vss. The signal output module of the initial signal output circuit may be configured to generate the initial input signal according to the first adjustment signal (not illustrated) and the second adjustment signal (not illustrated). The delayed output signal of the initial signal output circuit may be generated according to the first power signal Vdd and the second power signal Vss; that is, the initial input signal ActBnk0 output by the initial signal output circuit 710 can avoid the delay caused by the circuit elements of the signal output circuit, compared with the initial input signal ActBnk0 directly input from the external. The initial signal output circuit 710 here may be the same as the signal output circuit described above, which will not be repeated here, but the embodiments of the disclosure is not limited thereto.

In some embodiments of the disclosure, referring to FIGS. 10 and 11, the figures are introduced by taking a circuit 700 for outputting a delayed signal composed of four signal output circuits as an example. The first clock terminal ActClk of the signal output circuits may be configured to receive the first pulse signal ActClk. The second clock terminal PreClk of the signal output circuits may be configured to receive the second pulse signal PreClk. The first control terminal ActEn of the signal output circuits may be configured to receive the first control signal ActEn. The second control terminal PreEn of the signal output circuits may be configured to receive the second control signal PreEn. The signal output terminal ActBnk of the signal output circuits may be configured to output the delayed output signal of the current-stage signal output circuit. The signal output circuit may further include a first signal terminal ActEnPre and a second signal terminal PreEnPre (i.e., the signal input terminals of the signal output circuit). With reference to FIG. 11, the first signal terminal ActEnPre of the initial signal output circuit may be configured to receive the first power signal Vdd, and the second signal terminal PreEnPre of the initial signal output circuit may be configured to receive the second power signal Vss. The first signal terminal ActEnPre and the second signal terminal PreEnPre of other signal output circuits may be configured to receive the delayed output signal output by the previous-stage signal output circuit.

Referring to FIGS. 9 and 12, according to the aforementioned description, it can be known that the first-stage signal output circuit 701 may be configured to generate a first-stage delayed output signal ActBnk1 according to the initial input signal ActBnk0, and the second-stage signal output circuit 702 may be configured to generate a second-stage delayed output signal ActBnk2 according to the first-stage delayed output signal ActBnk1. The third-stage signal output circuit 703 may be configured to generate the third-stage delayed output signal ActBnk3 according to the second-stage delayed output signal ActBnk2, and the fourth-stage signal output circuit 704 may be configured to generate the fourth-stage delayed output signal ActBnk4 (not illustrated) according to the third-stage delayed output signal ActBnk3. The fifth-stage signal output circuit 705 may be configured to generate a fifth-stage delayed output signal ActBnk5 (not illustrated) according to the fourth-stage delayed output signal ActBnk4, the sixth-stage signal output circuit 706 may be configured to generate a sixth-stage delayed output signal ActBnk6 (not illustrated) according to the fifth-stage delayed output signal ActBnk5, and the seventh-stage signal output circuit 707 may be configured to generate a seventh-stage delayed output signal ActBnk7 (not illustrated) according to the sixth-stage delayed output signal ActBnk6.

It should be understood that the signal output circuit can be configured to generate a delayed signal with a controllable delay according to the first pulse signal and the second pulse signal. Compared with the input signal, the delayed signal may have a first delay on the rising edge and a second delay on the falling edge. Other signal output circuits may continue to delay the generated delayed signal, thereby generating stagger signals that are equally spaced. And at the same time, the operation of adjusting the delay time of the delayed signal does not need to connect more delay units, thereby simplifying the circuit structure, and making the area of the circuit layout smaller and the power consumption of the circuit lower.

It is worth mentioning that all of the units involved in the embodiments of the disclosure may be logical units. In practical applications, a logical unit can be realized by a physical unit, a part of the physical unit, or the combination of a plurality of physical units. In addition, in order to highlight the innovative part of the disclosure, the embodiments of the disclosure do not introduce units that are not closely related to solving the technical problems proposed by the disclosure, which does not indicate that there are no other units in the embodiments of the disclosure.

Since the aforementioned embodiments correspond to the embodiments of the disclosure, the embodiments of the disclosure can be implemented in cooperation with the aforementioned embodiments. The related technical details mentioned in the aforementioned embodiments are still valid in the embodiments of the disclosure, and the technical effects that can be achieved in the aforementioned embodiments can also be achieved in the embodiments of the disclosure. In order to reduce repetition, details will not be repeated here. Correspondingly, the related technical details mentioned in the embodiments of the disclosure can also be applied to the aforementioned embodiments.

Those of ordinary skill in the art can understand that the aforementioned embodiments are specific embodiments for realizing the disclosure; and in practical applications, various changes can be made to them in form and details without departing from the spirit and scope of the disclosure.

Embodiments of the disclosure provide a signal output circuit and a circuit for outputting delayed signal, where the signal output circuit includes: a first control module, a second control module and signal output module. The first control module is configured to receive a first pulse signal and an input signal, and output a first adjustment signal, a first preset edge of the first adjustment signal has a first delay relative to a rising edge of the input signal, the first delay being a pulse period of the first pulse signal. The second control module is configured to receive a second pulse signal and the input signal, and output a second adjustment signal, where a second preset edge of the second adjustment signal has a second delay relative to a falling edge of the input signal, the second delay being a pulse period of the second pulse signal. And the signal output module is configured to receive the first adjustment signal and the second adjustment signal, and output a delayed output signal, a rising edge of the delayed output signal is generated according to the first preset edge of the first adjustment signal, and a falling edge of the delayed output signal is generated according to the second preset edge of the second adjustment signal.

In the embodiments of the disclosure, a delayed output signal with a controllable delay can be generated according to the first pulse signal and the second pulse signal. Compared with the input signal, the delayed output signal has a first delay on the rising edge and has a second delay on the falling edge; the first delay is the pulse period of the first pulse signal, and the second delay is the pulse period of the second pulse signal. Therefore, the delay time of the delayed output signal can be adjusted by adjusting the pulse periods of the first pulse signal and the second pulse signal. At the same time, the operation of adjusting the delay time of the delayed output signal does not need to connect more delay units, thereby simplifying the circuit structure, making the area of the circuit layout smaller and the power consumption of the circuit lower.

The invention claimed is:

1. A signal output circuit, comprising:
a first control subcircuit, configured to receive a first pulse signal and an input signal, and output a first adjustment signal, wherein a first preset edge of the first adjustment signal has a first delay relative to a rising edge of the input signal, the first delay being a pulse period of the first pulse signal;
a second control subcircuit, configured to receive a second pulse signal and the input signal, and output a second adjustment signal, wherein a second preset edge of the second adjustment signal has a second delay relative to a falling edge of the input signal, the second delay being a pulse period of the second pulse signal; and
a signal output subcircuit, configured to receive the first adjustment signal and the second adjustment signal, and output a delayed output signal, a rising edge of the delayed output signal is generated according to the first preset edge of the first adjustment signal, and a falling edge of the delayed output signal is generated according to the second preset edge of the second adjustment signal.

2. The signal output circuit of claim 1, wherein the pulse period of the first pulse signal is equal to the pulse period of the second pulse signal.

3. The signal output circuit of claim 1, wherein one pulse of the first pulse signal is aligned with the rising edge of the input signal, and one pulse of the second pulse signal is aligned with the falling edge of the input signal.

4. The signal output circuit of claim 3, wherein the first pulse signal and the second pulse signal are staggered with each other.

5. The signal output circuit of claim 1, wherein the signal output subcircuit comprises:
a first receiving subcircuit, configured to receive the first pulse signal and the first adjustment signal, and generate a first pulse control signal when the first adjustment signal is at an active level, wherein a pulse phase of first pulse control signal is the same as a pulse phase of the first pulse signal;
a second receiving subcircuit, configured to receive the second pulse signal and the second adjustment signal, and generate a second pulse control signal when the second adjustment signal is at an active level, wherein a pulse phase of the second pulse control signal is the same as a pulse phase of the second pulse signal; and
a latch subcircuit, configured to receive the first pulse control signal and the second pulse control signal, and generate the delayed output signal.

6. The signal output circuit of claim 5, wherein the first receiving subcircuit is further configured to receive a first control signal, and generate the first pulse control signal according to the first pulse signal when the first adjustment signal and the first control signal are both at active levels.

7. The signal output circuit of claim 5, wherein the first receiving subcircuit comprises a first receiving NAND gate; and the first receiving NAND gate comprises a first input terminal, a second input terminal and a first output terminal, the first input terminal being configured to receive the first adjustment signal, the second input terminal being configured to receive the first pulse signal, and the first output terminal being configured to output the first pulse control signal.

8. The signal output circuit of claim 5, wherein the second receiving subcircuit is further configured to receive a second control signal, and generate the second pulse control signal according to the second pulse signal when the second adjustment signal and the second control signal are both at active levels.

9. The signal output circuit of claim 5, wherein the second receiving subcircuit comprises a second receiving NAND gate; and the second receiving NAND gate comprises a third input terminal, a fourth input terminal and a second output terminal, the third input terminal being configured to receive the second adjustment signal, the fourth input terminal being configured to receive the second pulse signal, and the second output terminal being configured to output the second pulse control signal.

10. The signal output circuit of claim 5, wherein the latch subcircuit comprises a latch, and the latch comprises a fifth input terminal, a sixth input terminal and a third output terminal, the fifth input terminal being configured to receive the first pulse control signal, the sixth input terminal being configured to receive the second pulse control signal, and the third output terminal being configured to output the delay output signal.

11. The signal output circuit of claim 10, wherein the latch subcircuit is configured such that:
the delayed output signal and the second pulse control signal are both at a same level, when the first pulse control signal and the second pulse control signal are at different levels; and
the latch subcircuit maintains a state, when the first pulse control signal and the second pulse control signal are both at high levels.

12. The signal output circuit of claim 1, wherein the first control subcircuit comprises: a first D-trigger, wherein a clock terminal of the first D-trigger is configured to receive the first pulse signal, a reset terminal of the first D-trigger is configured to receive a first reset signal, an input terminal of the first D-trigger is configured to receive the input signal, and an output terminal of the first D-trigger is configured to output the first adjustment signal.

13. The signal output circuit of claim 1, wherein the second control subcircuit comprises: a second D-trigger, wherein a clock terminal of the second D-trigger is configured to receive the second pulse signal, a reset terminal of the second D-trigger is configured to receive a second reset signal, an input terminal of the second D-trigger is configured to receive the input signal, and an output terminal of the second D-trigger is serially connected with an inverter and configured to output the second adjustment signal at an output of the inverter.

14. The signal output circuit of claim 1, further comprising: an even number of inverters, wherein the inverters are serially connected with an output terminal of the signal output subcircuit.

15. A circuit for outputting a delayed signal, comprising G signal output circuits, where G is an integer greater than or equal to 2;
wherein each of the G signal output circuits comprises:
a first control subcircuit, configured to receive a first pulse signal and an input signal, and output a first adjustment signal, wherein a first preset edge of the first adjustment signal has a first delay relative to a rising edge of the input signal, the first delay being a pulse period of the first pulse signal;
a second control subcircuit, configured to receive a second pulse signal and the input signal, and output a second adjustment signal, wherein a second preset edge of the second adjustment signal has a second delay relative to a falling edge of the input signal, the second delay being a pulse period of the second pulse signal; and
a signal output subcircuit, configured to receive the first adjustment signal and the second adjustment signal, and output a delayed output signal, a rising edge of the delayed output signal is generated according to the first preset edge of the first adjustment signal, and a falling edge of the delayed output signal is generated according to the second preset edge of the second adjustment signal;
wherein each stage of the signal output circuits is configured to receive a delayed output signal output by a previous-stage signal output circuit and generate a delayed output signal of a current-stage signal output circuit according to a first pulse signal, a second pulse signal and the delayed output signal output by the previous-stage signal output circuit;
wherein each of non-first-stage signal output circuits is configured to receive the delayed output signal output by the previous-stage signal output circuit as an input signal of a respective one of the non-first-stage signal output circuits; and a first-stage signal output circuit is configured to receive an initial input signal as an input signal of the first-stage signal output circuit;
wherein a rising edge of the delayed output signal generated by each of the signal output circuits has a first delay relative to a rising edge of the received delayed output signal output by the previous-stage signal output circuit; and
wherein a falling edge of the delayed output signal generated by each of the signal output circuits has a second delay relative to a falling edge of the received delayed output signal output by the previous-stage signal output circuit.

16. The circuit for outputting the delayed signal of claim 15, wherein a pulse period of the first pulse signal is equal to a pulse period of the second pulse signal.

17. The circuit for outputting the delayed signal of claim 15, wherein one pulse of the first pulse signal is aligned with the rising edge of the input signal, and one pulse of the second pulse signal is aligned with the falling edge of the input signal.

18. The circuit for outputting the delayed signal of claim 15, wherein the first pulse signal and the second pulse signal are staggered with each other.

19. The circuit for outputting the delayed signal of claim 15, the first control subcircuit of the signal output circuits is further configured to receive a first control signal, and the second control subcircuit of the signal output circuits is further configured to receive a second control signal, and the first control signal and the second control signal are inverted signals;
the each stage of the signal output circuits is configured to generate the delayed output signal of the current-stage signal output circuit according to the first control signal, the second control signal, the first pulse signal, the second pulse signal and the delayed output signal output by the previous-stage signal output circuit.

20. The circuit for outputting the delayed signal of claim 15, further comprising:
an initial signal output circuit comprising a first control subcircuit, a second control subcircuit, and a signal output subcircuit;
wherein the first control subcircuit of the initial signal output circuit is configured to receive the first pulse signal and a first power signal, and generate the first adjustment signal according to the first pulse signal and the first power signal;
the second control subcircuit of the initial signal output circuit is configured to receive the second pulse signal and a second power signal, and generate the second adjustment signal according to the second pulse signal and the second power signal;
the signal output subcircuit of the initial signal output circuit is configured to generate the initial input signal according to the first adjustment signal and the second adjustment signal.

\* \* \* \* \*